United States Patent
Nishikawa

(10) Patent No.: US 6,873,002 B2
(45) Date of Patent: Mar. 29, 2005

(54) SEMICONDUCTOR MEMORY DEVICE HAVING CYLINDER-TYPE STACKED CAPACITOR AND METHOD FOR FABRICATING SUCH A SEMICONDUCTOR MEMORY DEVICE

(75) Inventor: Nobuyuki Nishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 197 days.

(21) Appl. No.: 10/337,379

(22) Filed: Jan. 7, 2003

(65) Prior Publication Data

US 2004/0004240 A1 Jan. 8, 2004

(30) Foreign Application Priority Data

Jul. 8, 2002 (JP) ........................................ 2002-198934

(51) Int. Cl.[7] .................... H01L 27/108; H01L 29/76; H01L 29/94; H01L 31/119
(52) U.S. Cl. ........................................ 257/308; 257/310
(58) Field of Search .......................... 257/308, 309, 257/310, 311, 288, 295; 438/239, 240, 250, 253, 672, 675

(56) References Cited

U.S. PATENT DOCUMENTS

| | | | | |
|---|---|---|---|---|
| 5,688,713 A | * | 11/1997 | Linliu et al. ................ | 438/253 |
| 5,733,808 A | * | 3/1998 | Tseng .......................... | 438/239 |
| 5,956,587 A | * | 9/1999 | Chen et al. .................. | 438/255 |
| 6,316,726 B1 | * | 11/2001 | Hidaka et al. ............. | 174/52.2 |
| 6,686,620 B2 | * | 2/2004 | An et al. ..................... | 257/301 |
| 2002/0000598 A1 | * | 1/2002 | Kang et al. ................. | 257/301 |
| 2004/0147086 A1 | * | 7/2004 | Uhlenbrock et al. ........ | 438/396 |

FOREIGN PATENT DOCUMENTS

| | | |
|---|---|---|
| JP | 7-297364 | 11/1995 |
| JP | 8-335679 | 12/1996 |
| JP | 8-340091 | 12/1996 |

* cited by examiner

*Primary Examiner*—Carl Whitehead, Jr.
*Assistant Examiner*—William Vesperman
(74) *Attorney, Agent, or Firm*—Westerman, Hattori, Daniels & Adrian, LLP

(57) ABSTRACT

The semiconductor memory device comprises a glue layer defining a cylinder shell, a bottom electrode made of a material of the platinum group and covering the inner face and the outer face of the cylinder shell, a dielectric layer formed over the bottom electrode, and a top electrode positioned over the dielectric layer. The bottom electrode, the dielectric layer, and the top electrode comprise a cell capacitor.

10 Claims, 17 Drawing Sheets

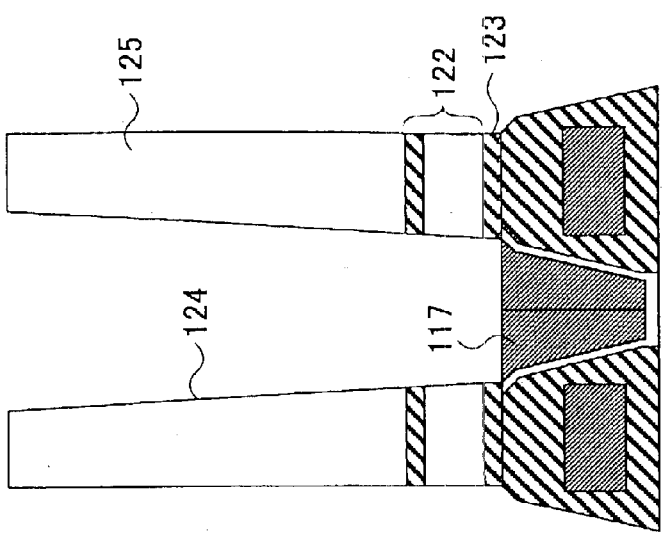
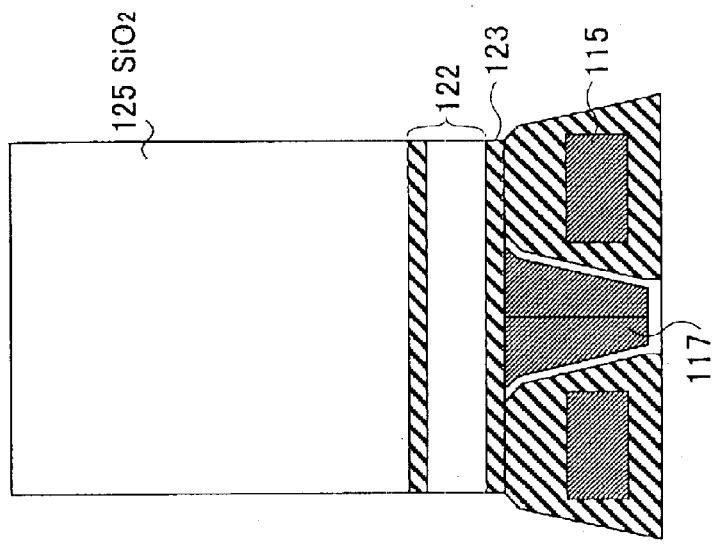
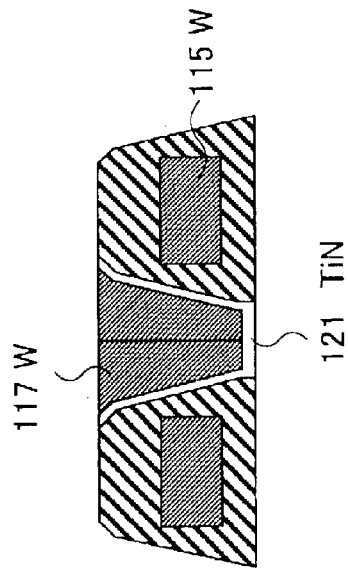
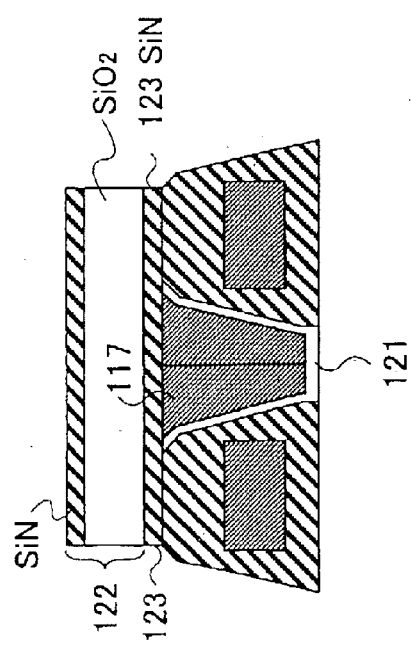
PRIOR ART

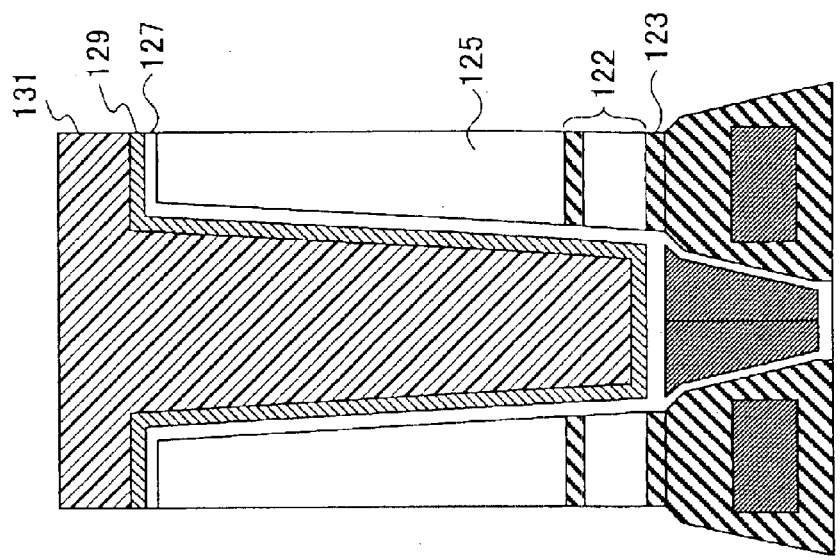
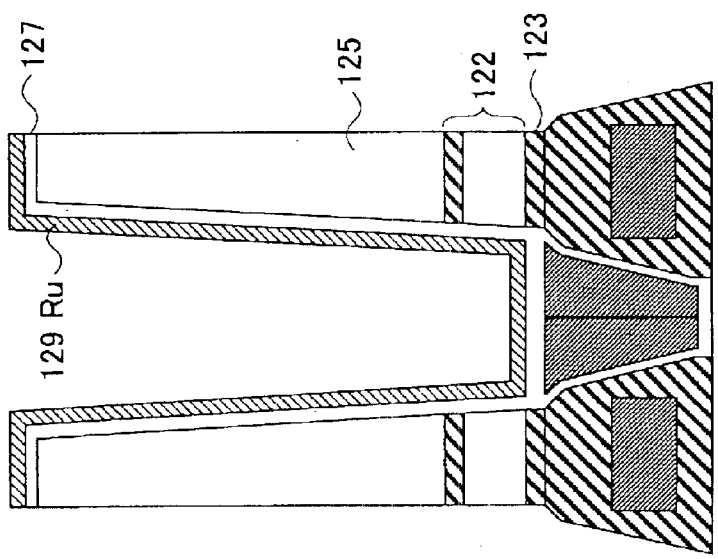
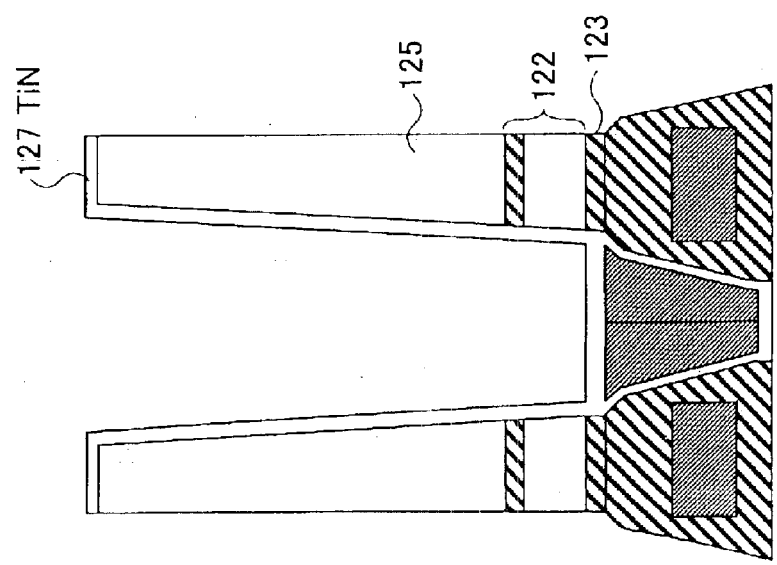

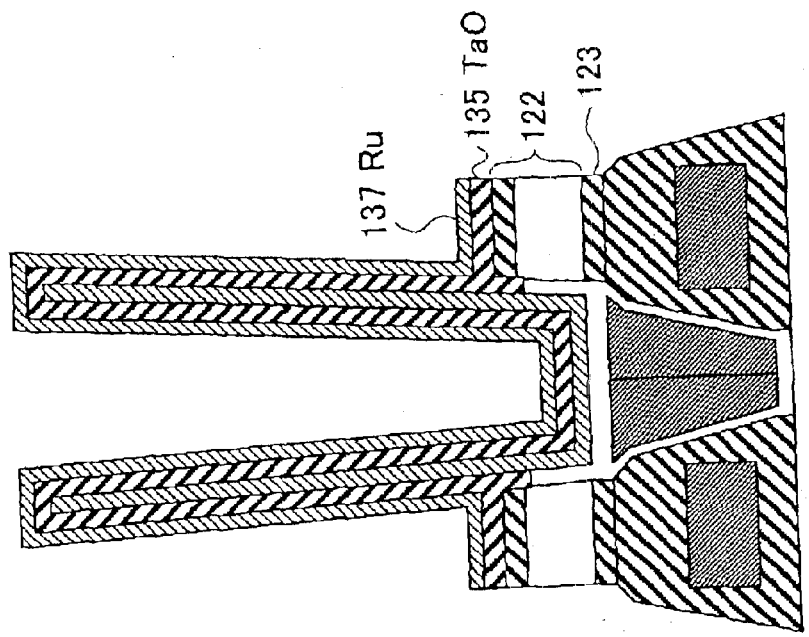
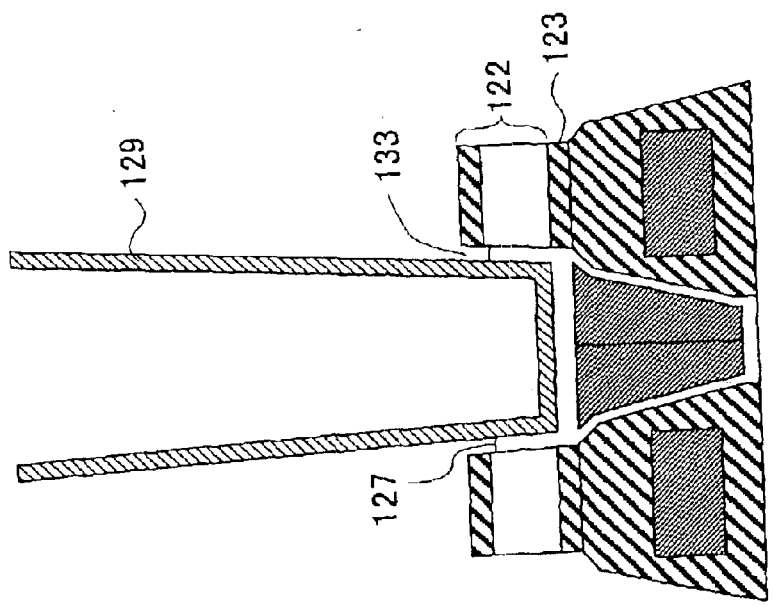

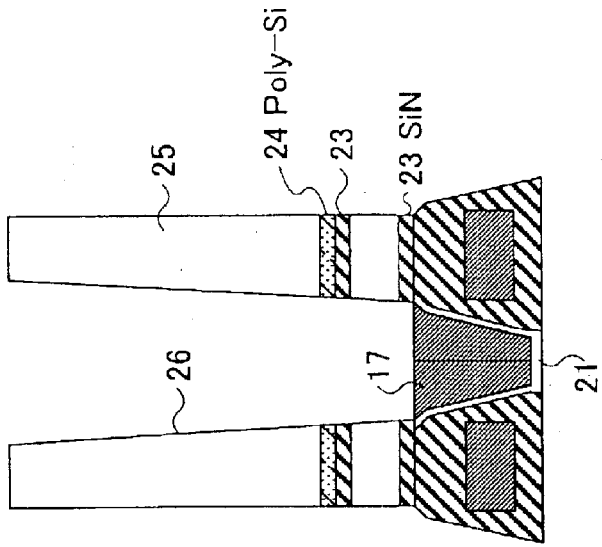
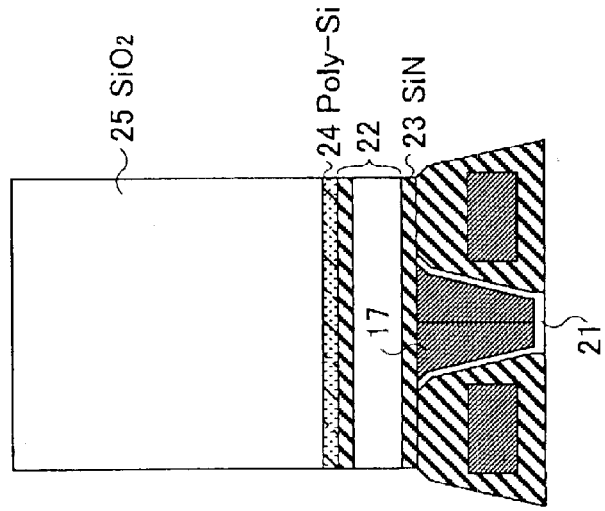
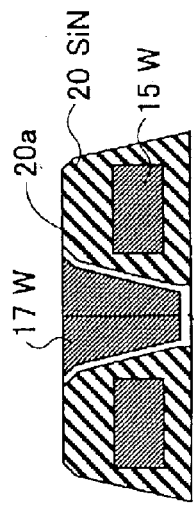
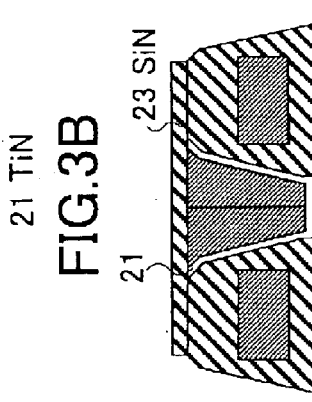
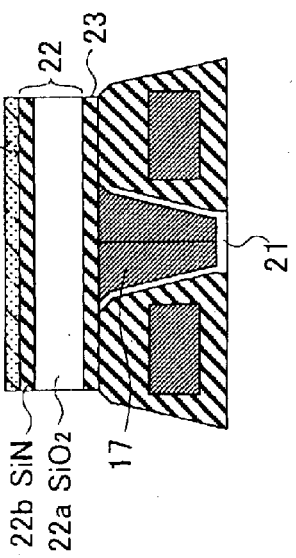

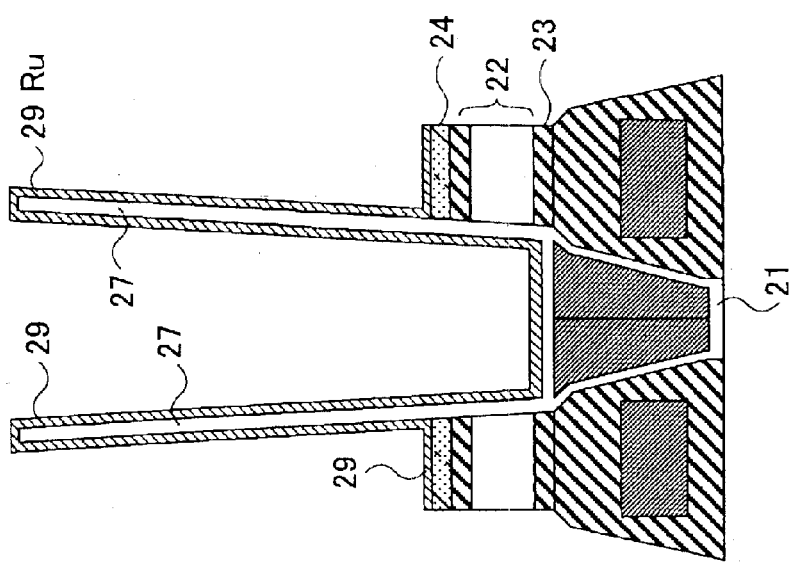
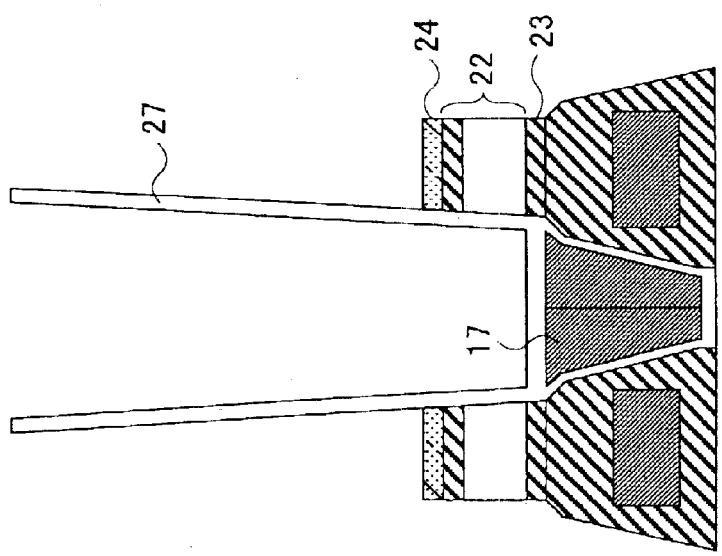
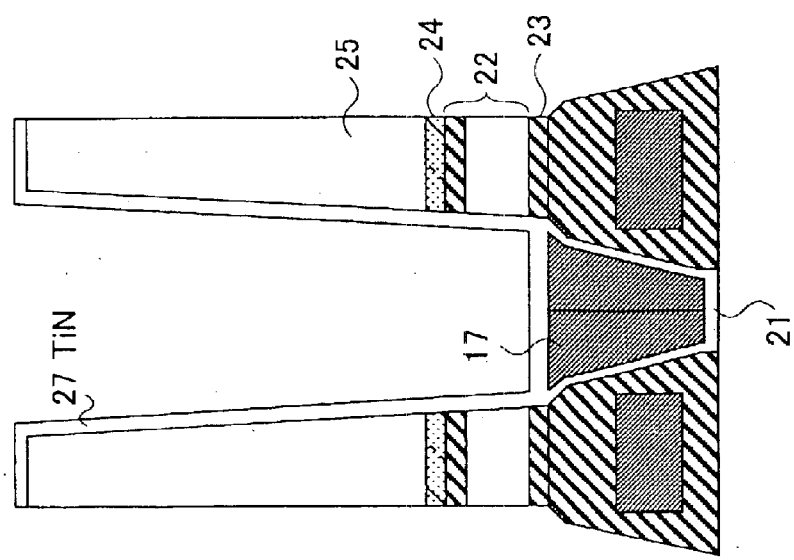

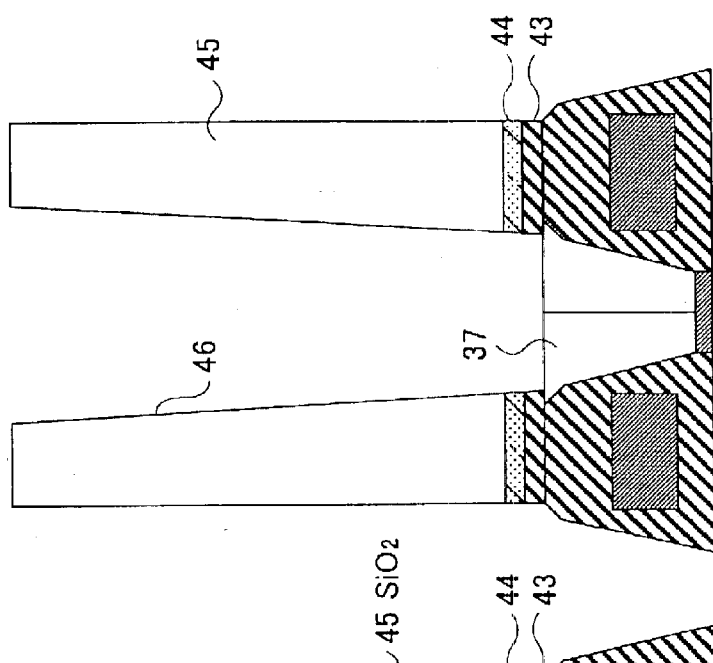
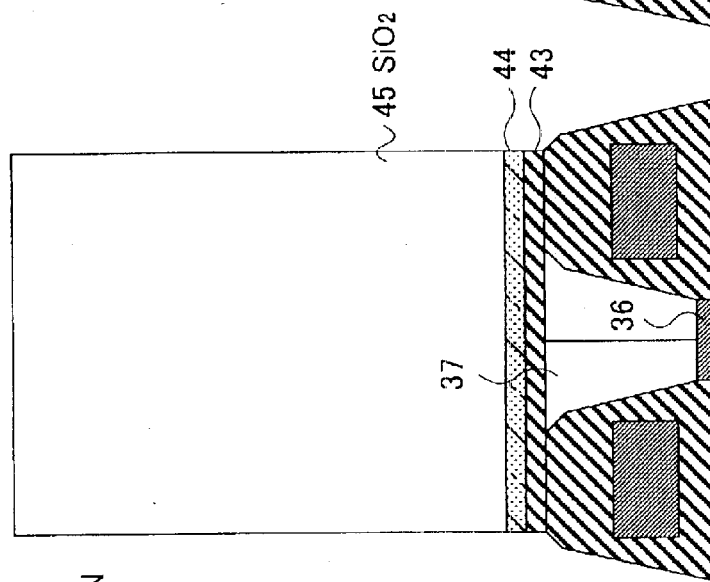
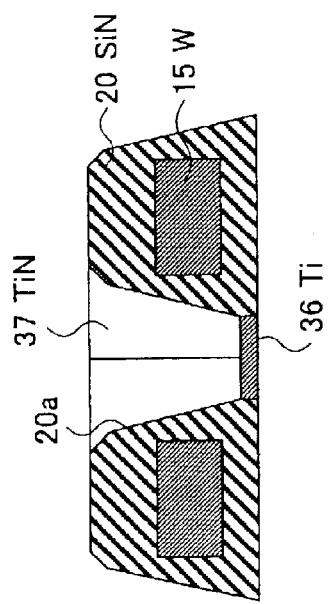
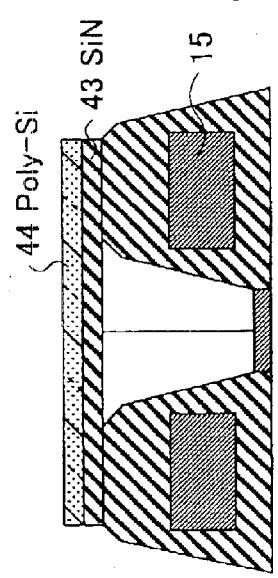

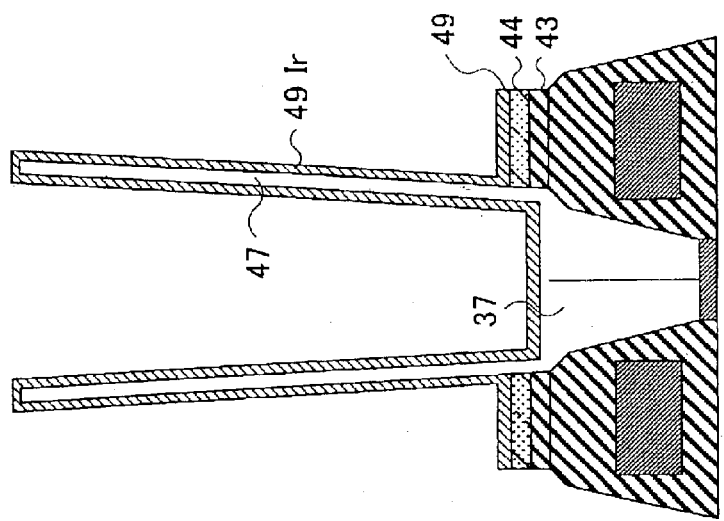
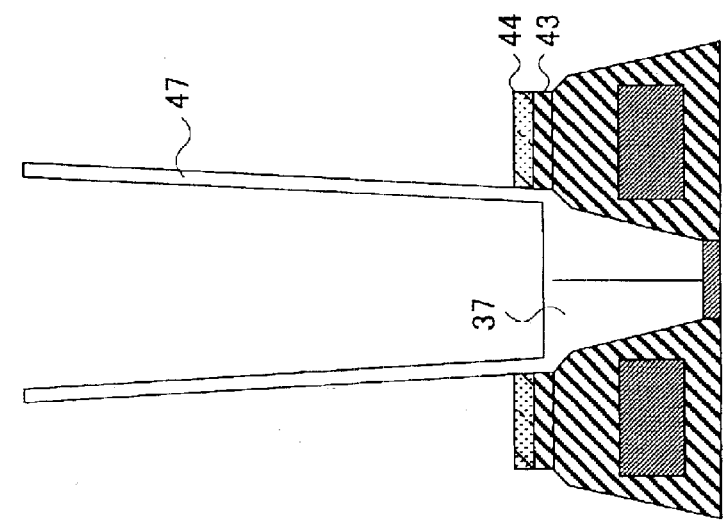
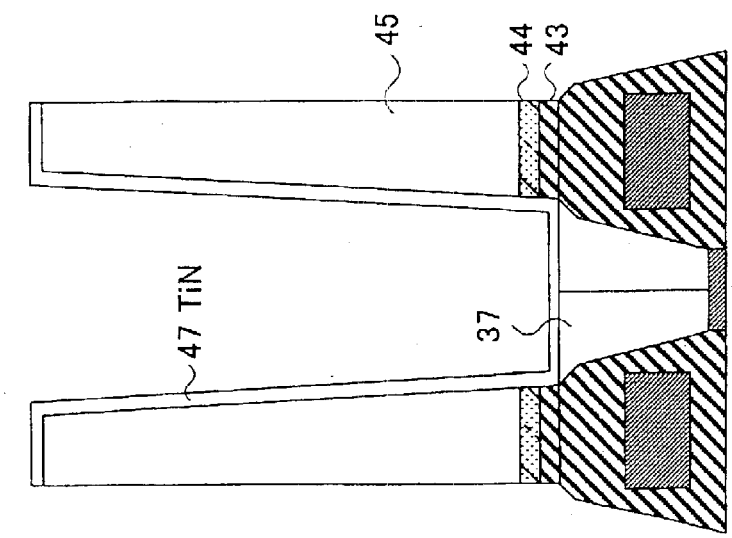

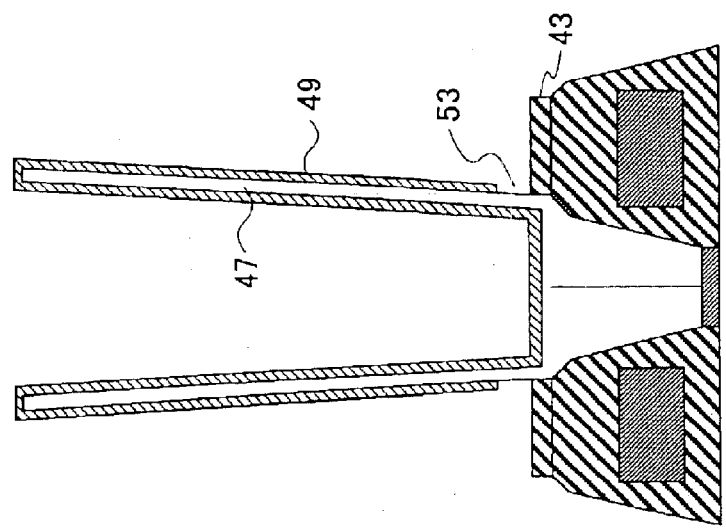
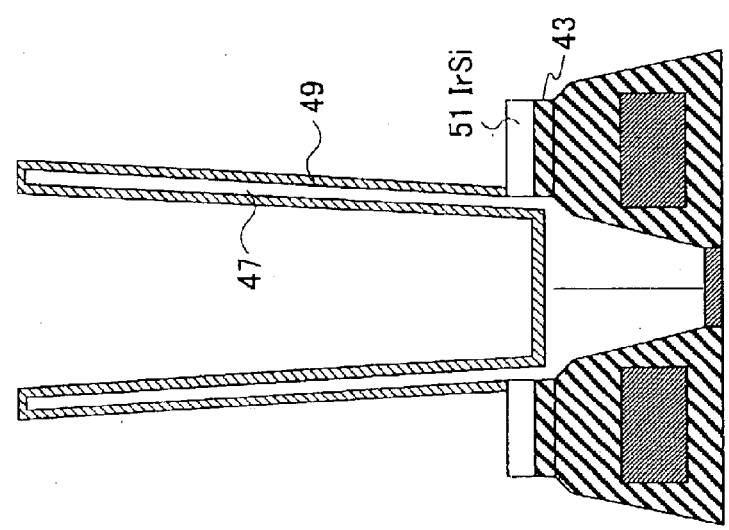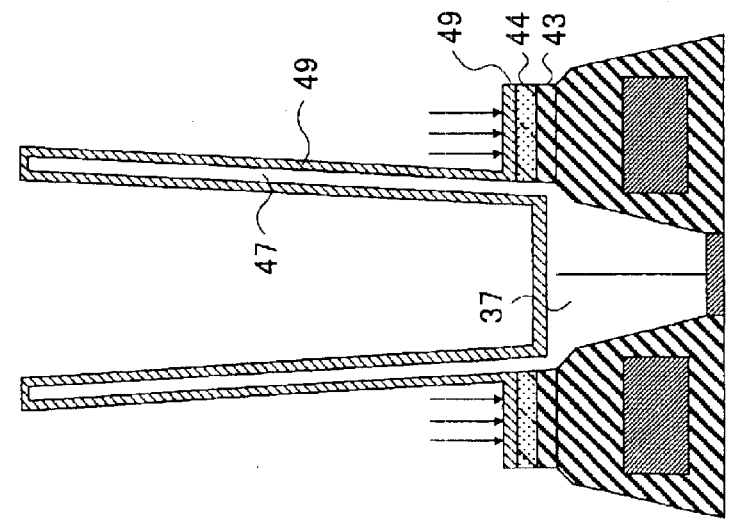

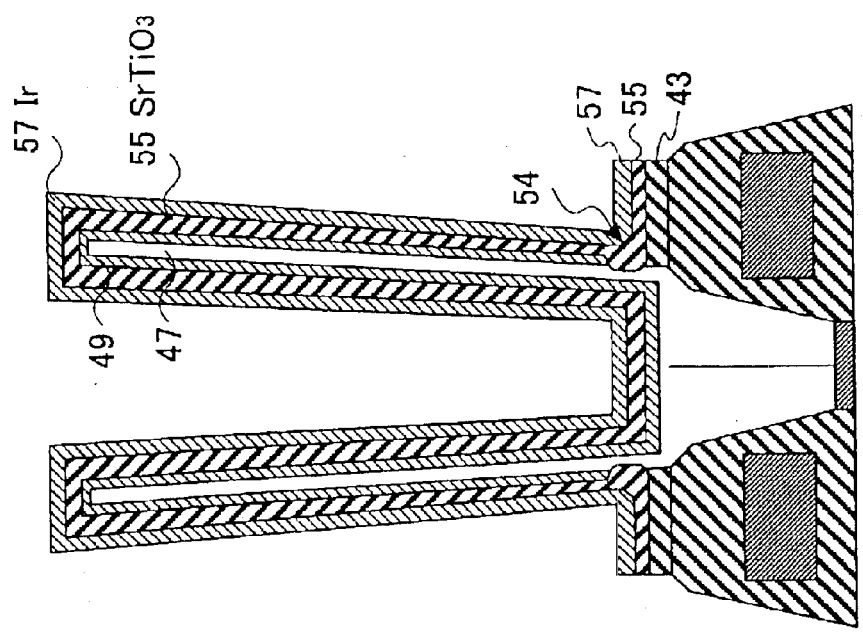
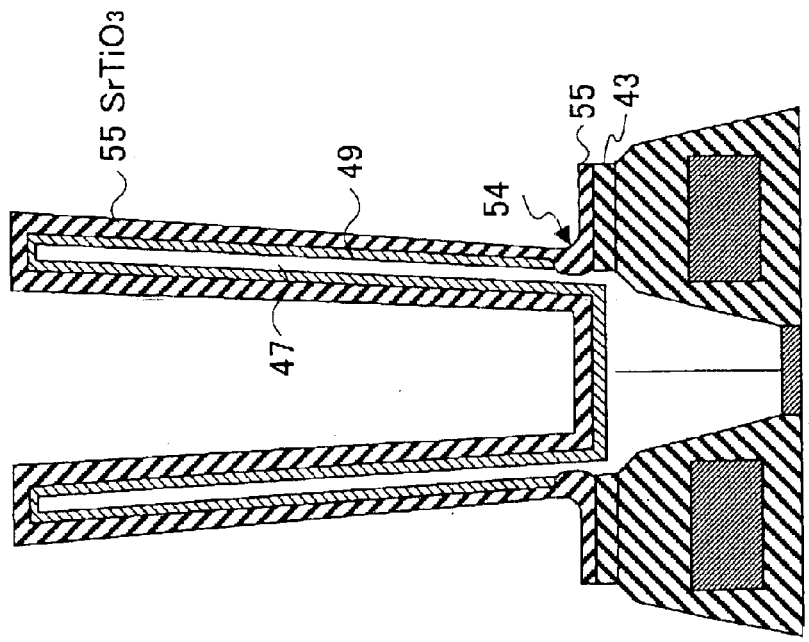

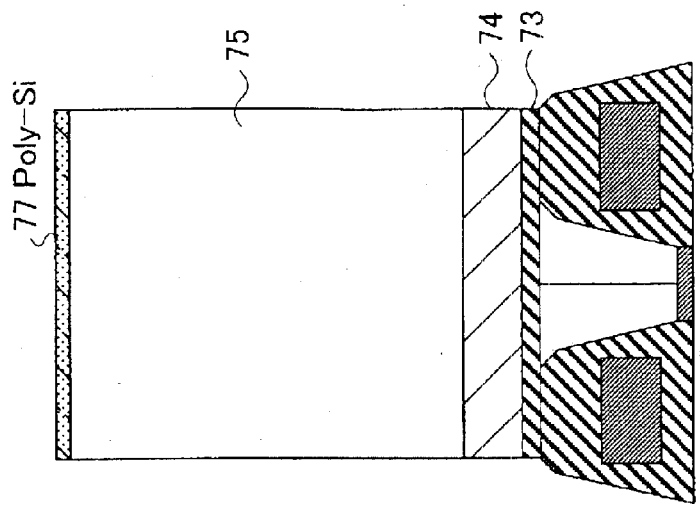
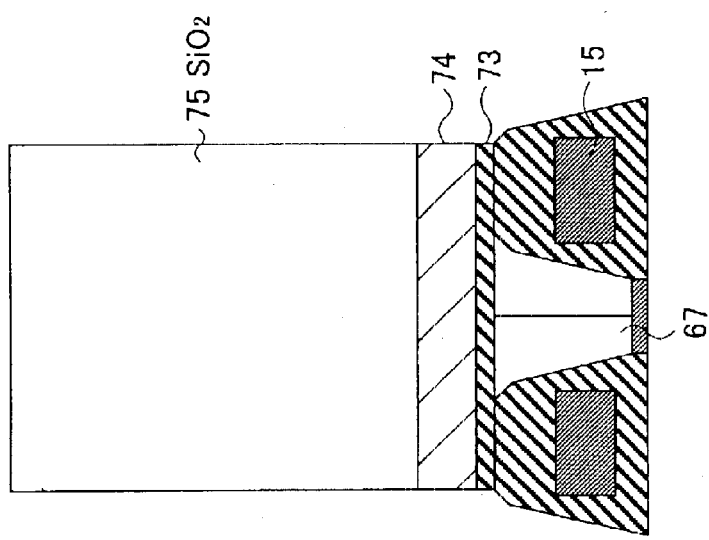
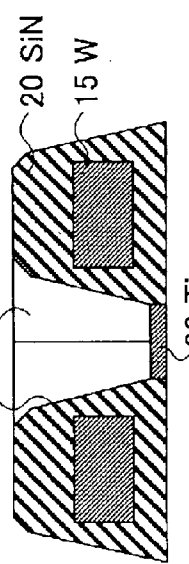
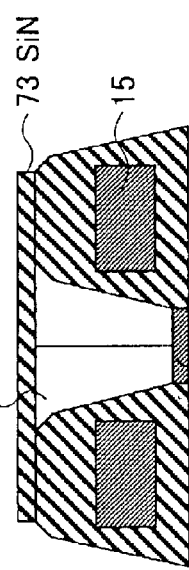
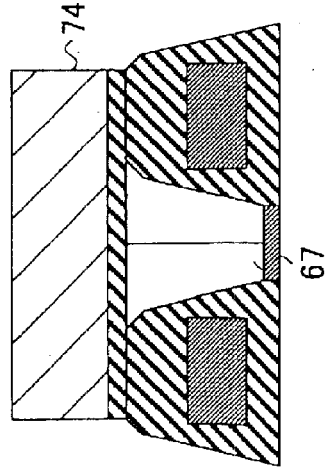

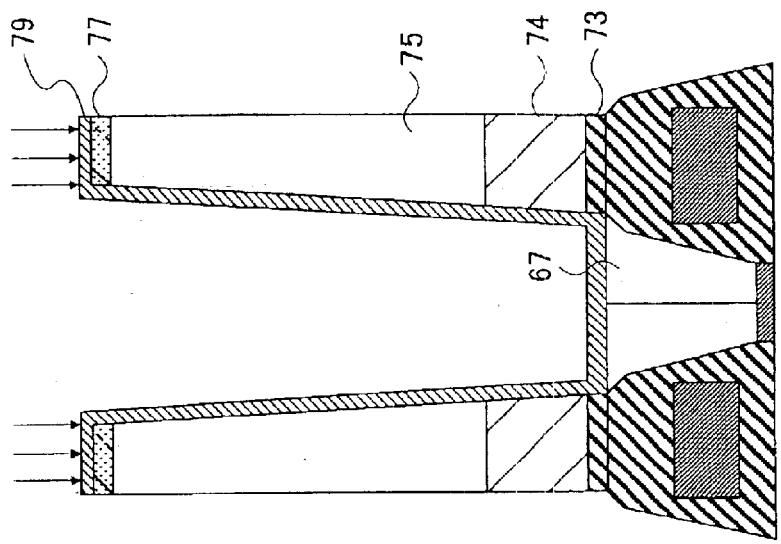
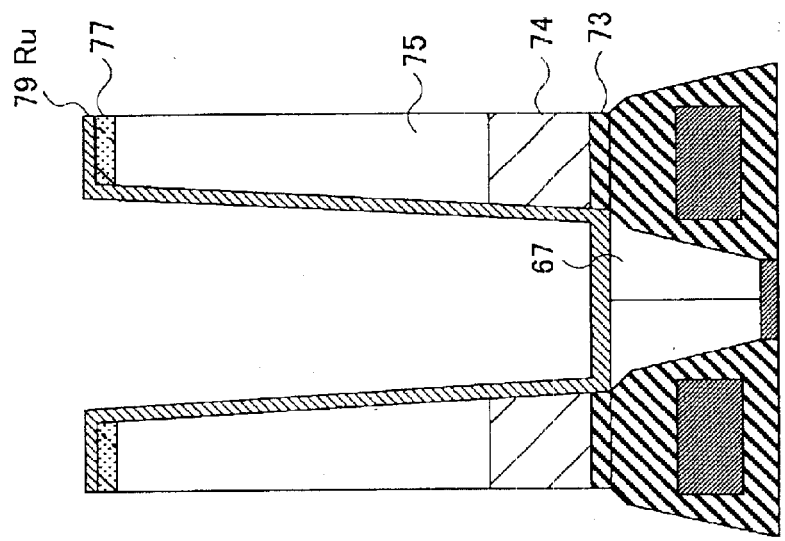
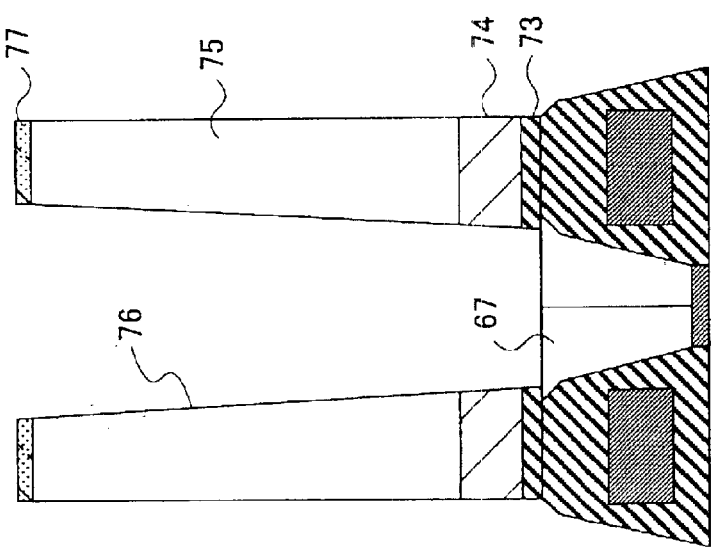

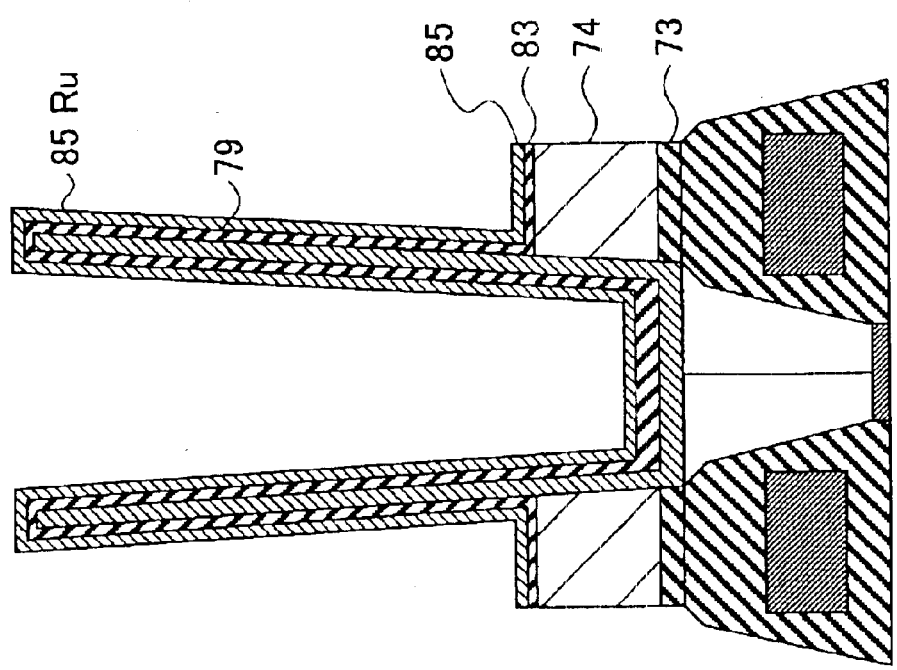

US 6,873,002 B2

SEMICONDUCTOR MEMORY DEVICE HAVING CYLINDER-TYPE STACKED CAPACITOR AND METHOD FOR FABRICATING SUCH A SEMICONDUCTOR MEMORY DEVICE

CROSS-REFERENCE TO RELATED APPLICATIONS

This patent application is based on and claims the benefit of the earlier filing date of Japanese Patent Application No. 2002-198934 filed on Jul. 8, 2002, the entire content of which is incorporated herein by reference.

BACKGROUND OF THE INVENTION

1. Field of the Invention

The present invention generally relates to fabrication of a semiconductor memory device, and more particularly, to a fabrication process of a semiconductor memory device having a cylinder-type stacked capacitor and to a semiconductor memory device fabricated by such a process.

2. Description of the Related Art

Along with a continuous trend toward increasing the capacities of memory devices, such as a DRAM or an FeRAM, the charge-storage structure has been shifting from a MIS (metal-insulator-semiconductor) structure to a MIM (metal-insulator-metal) structure, which is capable of achieving a larger capacitance. Various studies has also been made for dielectric materials of a cell capacitor, and it has been proposed to use high-dielectric constant materials, such as tantalum pentoxide and barium strontium titanate (BST:$Ba_xSr_{1-x}TiO_3$), or ferroelectric materials, such as lead zirconium titanate (PZT:$PbZr_xTi_{1-x}O_3$) and strontium bismuth tantalite (SBT:$SrBa_2Ta_2O_9$). When employing such a high dielectric material or a ferroelectric material, non-oxidizing conductive metals or conductive oxides are selected for the storage electrode, from the viewpoint of preventing peeling and leakage.

For example, ruthenium (Ru), iridium (Ir), and platinum (Pt), which belong to the platinum group, are used in the storage electrode because of their non-oxidizing characteristic. Conductive oxides, such as RuO2 or IrO2, and conductors with a perovskite structure, such as SrRuO, may also be used. To fabricate a storage electrode using these materials, a conductive layer is formed by physical film deposition, such as sputtering or vacuum evaporation, and the layer is subjected to a thermal process for the purposes of improving the adhesion, reducing hillocks and pin holes, and roughing the surface, as disclosed in JPA 7-297364, JPA 8-335679, and JPA 8-340091.

In general, it is difficult to process a metal of the platinum group, and particular techniques, such as CMP and dry etch, are required. In addition, the platinum-group metals are not so good in adhesion with electrically insulating materials. For this reason, a glue layer (which also referred to as a "barrier metal") made of, for example, titanium nitride (TiN) or tungsten nitride (WN), is inserted between the electrode layer and an interlevel dielectric (or an insulating layer) to improve the adhesion between them.

However, the glue layer comprising a refractory metal easily oxidizes upon touching an oxygen-containing high-dielectric constant material, such as tantalum penoxide or barium strontium titanate (BST). Oxidation of the glue layer may produce a leakage path, or cause peeling, and consequently, the electric characteristics of the device are adversely affected. To avoid such electrically adverse influence, some countermeasure has to be taken prior to forming an oxygen-containing high-dielectric constant film of a cell capacitor, so as to prevent the glue layer (or the barrier metal) from directly touching the dielectric material having a high dielectric constant. For instance, in the fabrication process of a cylinder-type stacked capacitor, the glue layer (or the barrier metal) is removed by a wet process prior to forming a high-dielectric constant film.

FIGS. 1A through 1L illustrate a conventional fabrication process of a cylinder-type stacked capacitor. Brief explanation will be made of the conventional fabrication process. Prior to forming a cell capacitor (i.e., a charge storage capacitor), tungsten (W) plug 117 protected by a titanium nitride (TiN) layer 121 is formed between the bit lines 115, as illustrated in FIG. 1A. The plug 117 electrically connects the cell capacitor to an underlying access transistor (not shown). Then, a support layer 123 and a base 122 are successively formed, as illustrated in FIG. 1B. Then, a silicon dioxide ($SiO_2$) interlevel dielectric 125 is formed over the base 122, as illustrated in FIG. 1C. A hole 124 for accommodating a storage node is formed by etching the $SiO_2$ interlevel dielectric 125, the base 122, and the support layer 123 until the plug 117 is exposed, as illustrated in FIG. 1D.

Then, a titanium nitride (TiN) glue layer 127 and a bottom electrode layer 129 are successively formed inside the hole 124, as illustrated in FIG. 1E and FIG. 1F. The bottom electrode layer 129 is made of a metal of the platinum group, for example, ruthenium (Ru). The hole is filled with a resist material 131, as illustrated in FIG. 1G.

The surface is planarized until the $SiO_2$ interlevel dielectric 125 is exposed, as illustrated in FIG. 1H. In this planarization, the bottom electrode layer 129 positioned over the top of the $SiO_2$ interlevel dielectric 125 is removed by chemical mechanical polishing (CMP) to isolate adjacent cell capacitors, and then, TiN glue layer 127 positioned on the top of the $SiO_2$ interlevel dielectric 125 is removed by reactive ion etching (RIE). Then, the $SiO_2$ interlevel dielectric 125 is removed by wet etching using BHF, and the resist 131 filled in the hole is removed by stripping (or "ashing"), as illustrated in FIG. 1I and FIG. 1J, respectively. At this point of time, the TiN glue layer 127 and the bottom electrode layer 129, which are shaped into a cylinder shell, are left.

As has been described above, if an oxygen-containing high-dielectric constant film or an oxidic ferroelectric film is formed directly over the glue layer 127 of a refractory metal, such as titanium nitride (TiN), the glue layer 127 is oxidized easily. Accordingly, the glue layer 127 is removed by a wet process prior to forming a dielectric layer of the capacitor, as illustrated in FIG. 1K. Then, a tantalum oxide (TaO) dielectric layer 135 is formed directly on the bottom electrode layer 129 that defines a cylinder shell, and subsequently, a top electrode layer 137 is formed over the TaO dielectric layer 135 using a metal of the platinum group, such as ruthenium (Ru), as illustrated in FIG. 1L. In this manner, the conventional cylinder-type stacked capacitor is completed.

With the conventional fabrication process, a gap or a groove 133 is produced around the cylinder shell, between the base 122 and the bottom electrode layer 129 near the surface of the base 122, during the removal of the TiN glue layer 127, as illustrated in FIG. 1K. The gap 133 becomes a serious problem because the base 122 for supporting the cylinder shell of the bottom electrode layer 129 becomes unstable. Such instability may cause the cylinder shell to fall down, or at the worst, the cylinder itself may become separated from the base 122 during the wet process.

Furthermore, if there are pin holes in the bottom electrode layer 129, the TiN glue layer 127 positioned on the top face of the plug 117 may melt during the wet process, which results in the tungsten (W) plug 117 being lost due to the cell effect.

After all, the glue layer (or the barrier metal) 127 formed for the purpose of improving the adhesion between the bottom electrode film 129 of a platinum-group metal and the $SiO_2$ interlevel dielectric 125 has to be removed in order to prevent leakage current due to omission of oxygen from the dielectric layer of the cell capacitor, in spite of the above-described problems. Consequently, the fabrication process becomes complicated with the increased number of fabrication steps and the increased fabrication cost.

Still another problem is difficulty of cell isolation because a portion of the bottom electrode layer 129 comprising a platinum-group metal has to be processed using a CMP method.

SUMMARY OF THE INVENTION

Therefore, it is an object of the present invention to overcome these problems in the prior art technique, and to provide a technique of fabrication of a semiconductor memory device, which can prevent loss melting of the plug and the cylinder shell from falling, while increasing the yield.

It is also an object of the present invention to provide a method for fabricating a semiconductor memory device that can facilitate processing of an electrode material belonging to the platinum group and can reduce the number of fabrication steps.

To achieve the objects, a combination of silicidation and wet etching is employed to process a bottom electrode. A portion of the bottom electrode layer made of a platinum-group material is silicidized, and the resulting silicide is selectively removed by a wet process. Consequently, a bottom electrode is defined easily and precisely, and at the same time a cell capacitor is isolated from adjacent cells in a reliable manner.

To be more precise, in one aspect of the invention, a method for fabricating a semiconductor memory device comprises the following steps:

(a) forming a bottom electrode layer having a cylindrical wall using a material of the platinum group;
(b) forming a silicide region in a portion of the bottom electrode layer;
(c) selectively removing the silicide region to define a bottom electrode and simultaneously to isolate a cell capacitor;
(d) forming a dielectric layer over the bottom electrode; and
(e) forming a top electrode over the dielectric layer.

The silicide is selectively removed by a wet process. This arrangement facilitates processing of the bottom electrode made of a platinum-group material, and allows adjacent cell capacitors to be isolated precisely and easily.

Preferably, the method further comprises a step of forming a cylindrical shell using a refractory material before the bottom electrode layer is formed. The cylindrical shell made of the refractory material is maintained in the semiconductor memory device, without being removed during the fabrication process. This arrangement allows the bottom electrode layer of the cylinder-type stacked capacitor to be held stably throughout the fabrication process, eliminating the prior art defects, such as a fall of the cylinder or plug loss.

Alternatively, the cylinder shell may be formed directly by the bottom electrode layer, without using a refractory material. In this case, a retaining layer for retaining the cylinder shell is formed, prior to forming the bottom electrode layer, using a material having good adhesion with the bottom electrode material of the platinum group.

In the second aspect of the invention, a semiconductor memory device is provided. The semiconductor memory device comprises a glue layer made of a refractory metal and shaped into a cylinder shell, a bottom electrode made of a metal of the platinum group and covering the inner and outer surfaces of the cylinder shell, a dielectric layer formed over the bottom electrode, and a top electrode positioned over the dielectric layer.

The bottom electrode, the dielectric layer, and the top electrode comprise a cell capacitor. Since the bottom electrode is supported by the glue layer in a stable manner, the product yield is improved, and reliable operations of the semiconductor memory device are guaranteed.

The dielectric layer has a thickened portion around the outer face of the cylinder shell near the bottom of the cylinder shell, which functions as a cell isolation part for separating a cell capacitor from adjacent cell capacitors.

The semiconductor memory device further has a base layer for retaining the cylinder shell, and the end portion of the cell isolation part is located between the lower end of the bottom electrode on the outer face of the cylinder shell and the base layer.

BRIEF DESCRIPTION OF THE DRAWINGS

Other objects, features, and advantages of the present invention will become more apparent from the following detailed description when read in conjunction with the accompanying drawings, in which:

FIGS. 1A through 1L illustrate a conventional fabrication process of a cylinder-type stacked capacitor;

FIGS. 3A through 3M illustrate a fabrication process of a semiconductor memory device having a cylinder-type stacked capacitor according to the first embodiment of the invention;

FIGS. 4A through 4L illustrate a fabrication process of a semiconductor memory device having a cylinder-type stacked capacitor according to the second embodiment of the invention; and FIGS. 5A through 5L illustrate a fabrication process of a semiconductor memory having a cylinder-type stacked capacitor according to the third embodiment of the invention.

DETAILED DESCRIPTION OF THE PREFERRED EMBODIMENTS

The preferred embodiments of the present invention will now be described in detail with reference to the attached drawings.

Figure 1H:
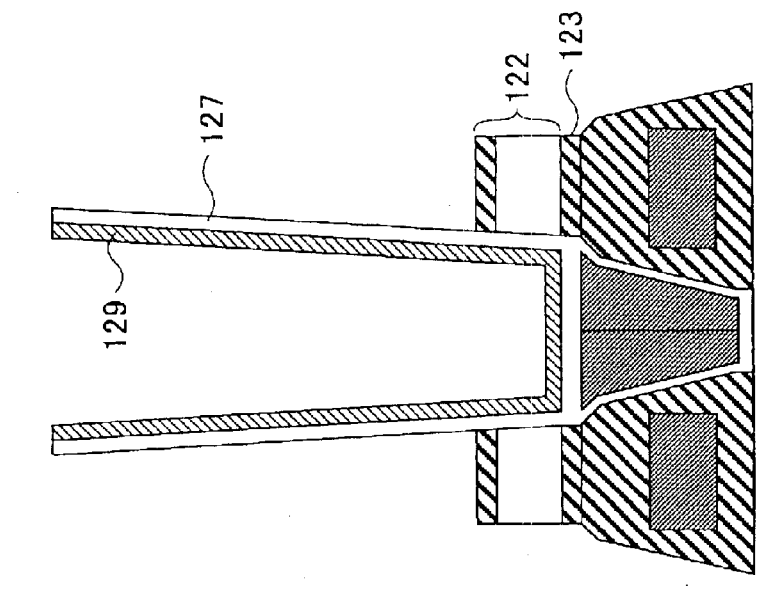
Figure 1I:
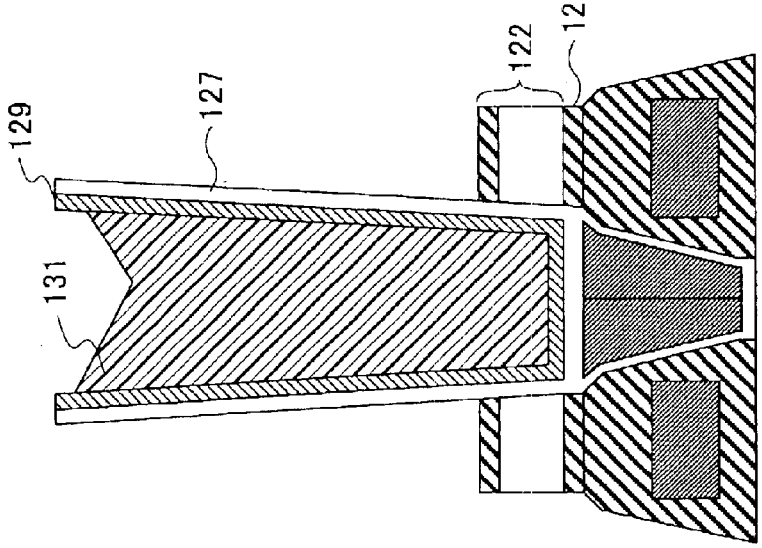
Figure 1J:
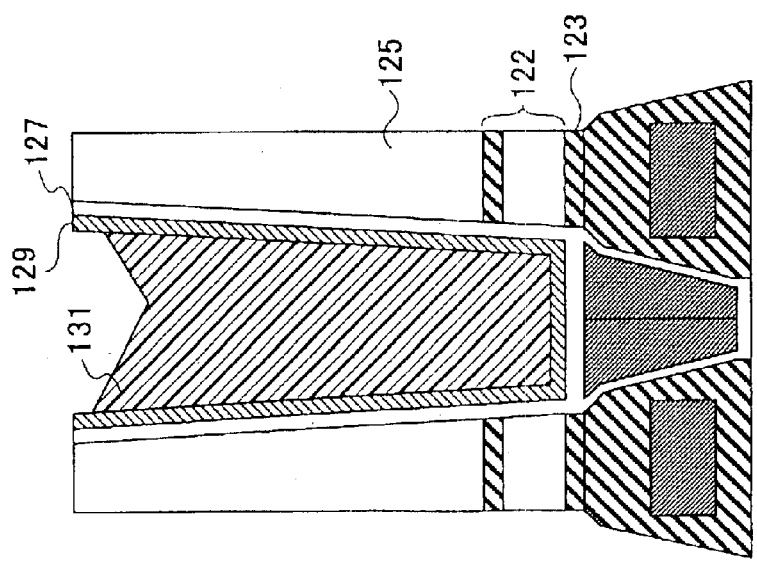
Figure 2A:
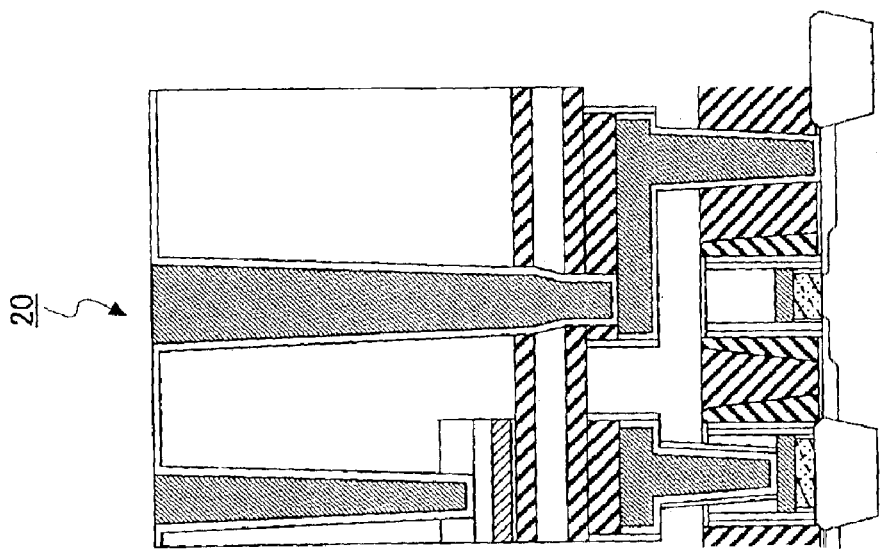
FIG. 2 illustrates an example of dynamic random access memory (referred to as "DRAM") to which the present invention is applied.
Figure 2B:
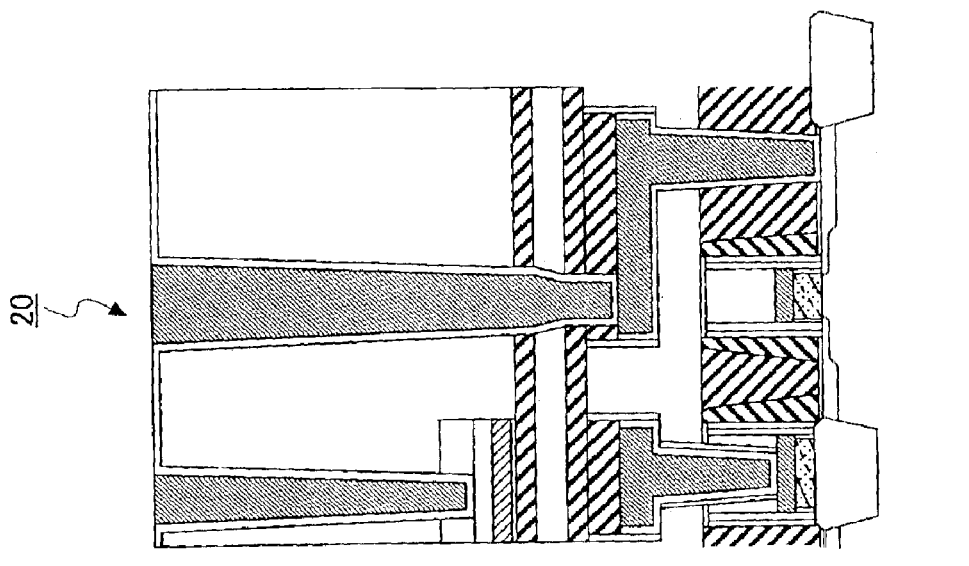
Figure 2C:
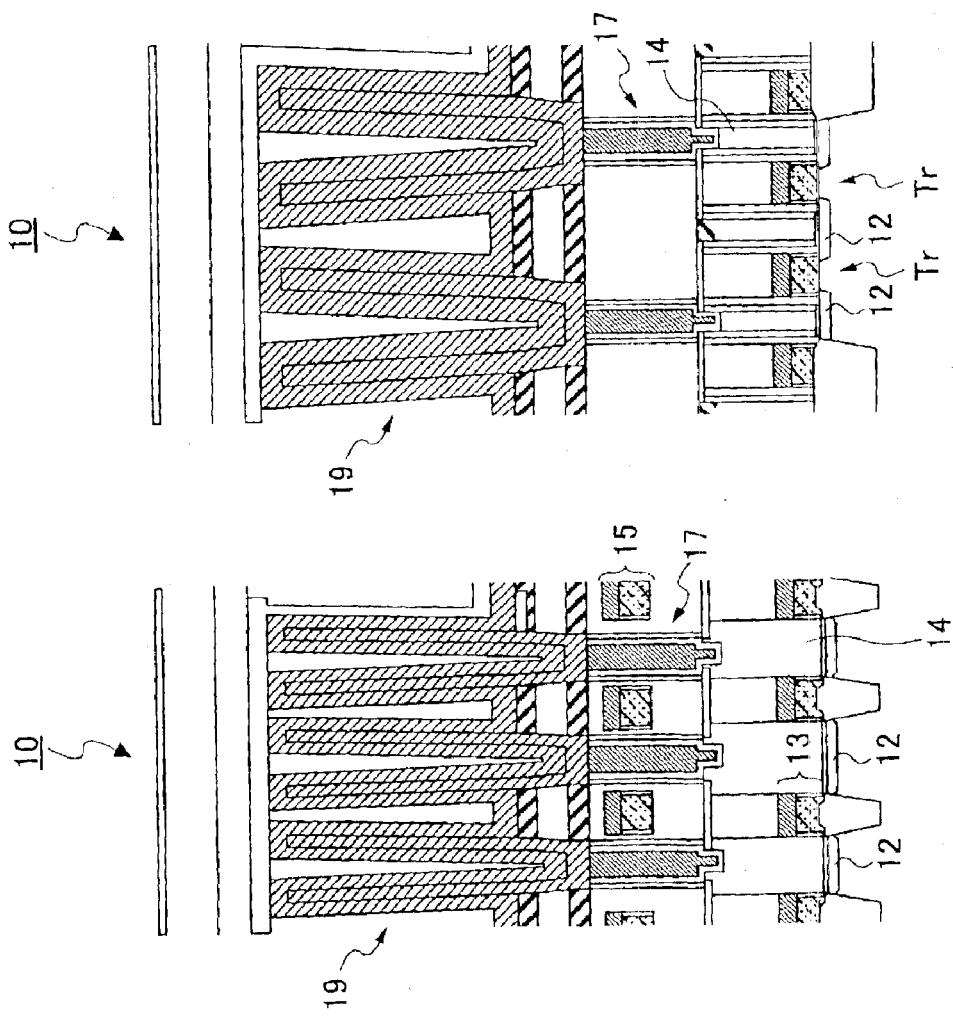

FIG. 2 illustrates an example of a semiconductor memory device to which the present invention is applied. FIGS. 2A and 2B are cross-sectional views of DRAM cell area 10 of the semiconductor memory device, and FIG. 2C is a cross-sectional view of a peripheral circuit of the semiconductor memory device. The present invention is applied to cell capacitor 19 illustrated in FIGS. 2A and 2B.

Capacitor 19 is a cylinder-type stacked capacitor located above the associated access transistor Tr. The capacitor 19 is coupled to one of the diffusion areas 12 of the access transistor Tr via a metal plug 17 and a polysilicon plug 14. The other diffusion areas 12 of the access transistor Tr is electrically connected to the bit line 15. The gate 13 of the access transistor Tr is coupled to a word line (not shown), or alternatively, the gate 13 may be a portion of the word line.

The process of fabricating the capacitor 19, as well as the structure of the resulting capacitor 19, will be explained in detail below based on the preferred embodiments.

FIGS. 3A through 3M illustrate a fabrication process of a semiconductor memory device having a cylinder-type stacked capacitor according to the first embodiment of the invention.

First, as illustrated in FIG. 3A, a plug 17 comprising tungsten (W) is formed between the bit lines 15. When forming the plug 17, a barrier metal layer 21 comprising a refractory material with a high melting point and a low reactivity, such as titanium nitride (TiN), is deposited inside a hole 20a formed in SiN insulating layer 20. Then, the hole 20a is filled with tungsten (W), and the surface is planarized by a CMP process. The barrier metal layer 21 prevents mutual diffusion of a metal and a semiconductor during a thermal process, which is generally caused due to direct contact between the metal and the semiconductor. Simultaneously, the barrier metal layer 21 functions as a glue layer for enhancing adhesion between the metal and the insulating layer 20.

Then, as illustrated in FIG. 3B, a silicon nitride (SiN) support layer 23 is formed up to a thickness of about 40 nm. Subsequently, a base layer 22 comprising an SiO2 layer 22a with a thickness of about 100 nm and an SiN layer 22b with a thickness of about 40 nm is formed, as illustrated in FIG. 3C. The support layer 23 and/or the base layer 22 functions as a retainer for retaining a cylinder shell to be formed in the subsequent steps. Then, a polysilicon layer 24 is formed over the base layer 22. The polysilicon layer 24 is to be used in the subsequent steps for silicidation of a portion of a bottom electrode layer comprising a platinum-group metal.

Then, as illustrated in FIG. 3D, $SiO_2$ insulating layer 25 with a thickness of 900 nm is formed over the polysilicon layer 24. The $SiO_2$ insulating layer 25 is placed in order to form a storage electrode of a cell capacitor above an access transistor (see FIG. 2) and the plug 17.

Then, as illustrated in FIG. 3E, a hole 26 reaching the plug 17 is formed by successively removing the $SiO_2$ insulating layer 25, the polysilicon layer 24, the base layer 22, and the support layer 23.

Then, as illustrated in FIG. 3F, titanium nitride (TiN) layer 27 with a thickness of 10 nm is formed in the hole 26 and over the $SiO_2$ insulating layer 25 by chemical vapor deposition (CVD). The TiN layer 27 functions as a glue layer or a barrier metal layer, which will be maintained as a portion of a cylinder shell throughout the fabrication process. Although not shown in the drawing, the hole is filled with a resist or a SOG layer after the formation of TiN glue layer 27. Then, the TiN glue layer 27 located on the top face of the $SiO_2$ insulating layer 25 is selectively removed by etching or CMP.

Then, as illustrated in FIG. 3G, the $SiO_2$ insulating layer 25 is removed by a wet process. As a result of the wet process, the TiN glue layer 27 defining a cylinder shell remains, and the polysilicon layer 24 is exposed. The resist or the SOG layer filled inside the hole is also removed. The TiN cylinder shell is retained by the support layer 23, the base layer 22, and the polysilicon layer 24 at and near the bottom of the cylinder.

Then, as illustrated in FIG. 3H, a bottom electrode layer 29 comprising ruthenium (Ru) with a thickness of 5 nm is formed over the TiN glue layer 27 and the polysilicon layer 24 by chemical vapor deposition (CVD). The CVD process is carried out using biscyclopentadienyl ruthenium (Ru (EtCp)$_2$) as a precursor gas at a temperature from 300 to 330 degrees C. Alternatively, the bottom electrode layer 29 may be formed by a combination of CVD and sputtering. The inner face and the outer face of the cylinder shell of the TiN glue layer 27, and the top surface of the polysilicon layer 24, are covered with the Ru layer 29.

Figure 3I:
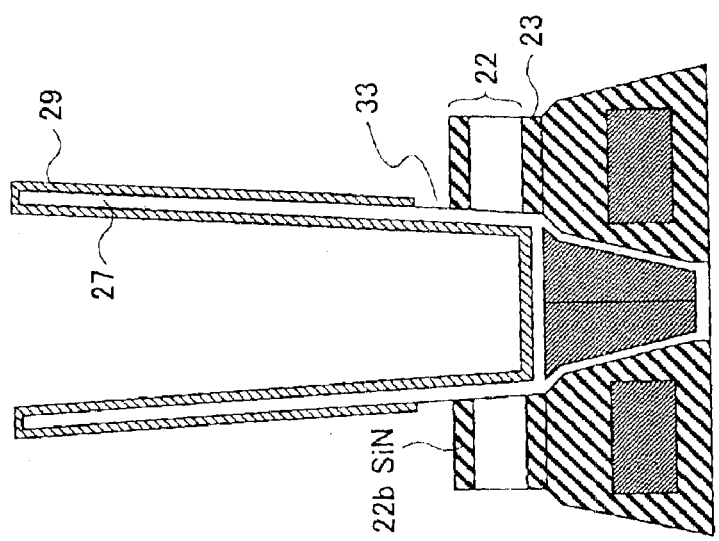

Then, as illustrated in FIG. 3I, a thermal process is carried out to silicidize a portion of the Ru layer 29 located directly above the polysilicon layer 24. This silicidation is carried out by rapid thermal anneal (RTA) at 400–450 degrees C. for 60 seconds.

Figure 3J:
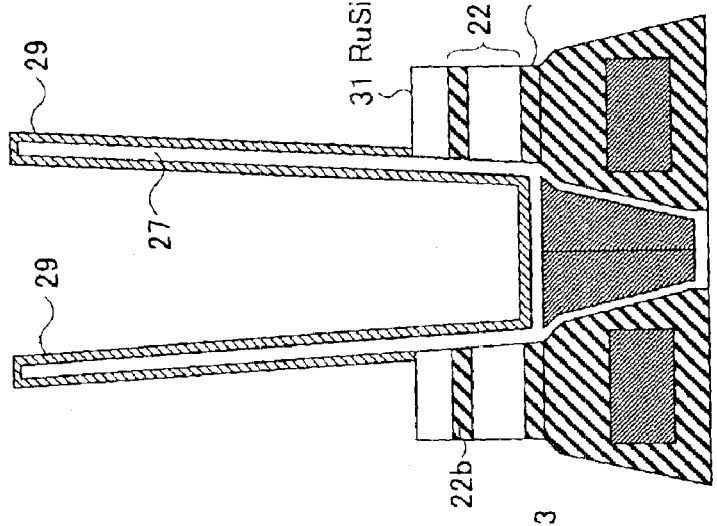

As the result of the RTA process, silicide (RuSi) 31 is formed in place of the polysilicon layer 24 and a portion of the Ru layer 29 located directly above the polysilicon layer 24, as illustrated in FIG. 3J. The silicon nitride (SiN) layer 22b of the base layer 22 functions as a stopper, and stops the reaction between ruthenium (Ru) and silicon (Si) in the vertical direction during the thermal process. The reaction in the horizontal direction is stopped by the TiN glue layer 27.

Figure 3K:
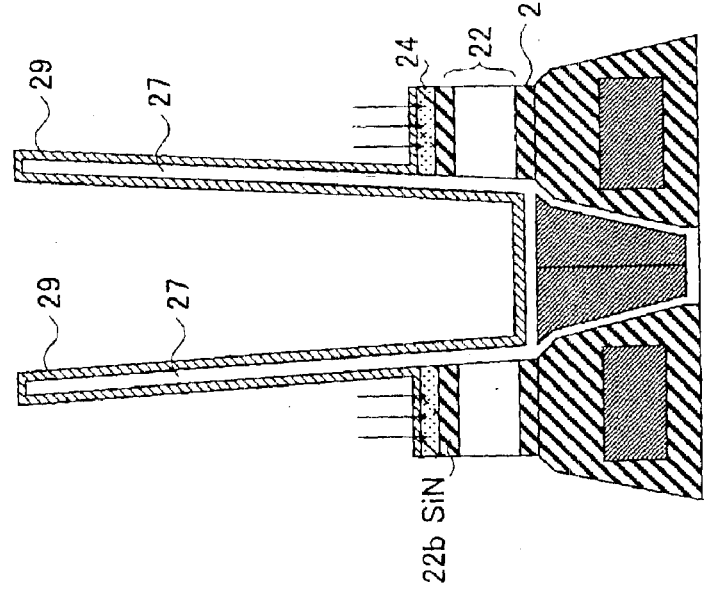

Then, as illustrated in FIG. 3K, the silicide 31 is removed by a wet process using an etchant or stripping chemicals of hydrofluoric acid family. For example, 5% hydrofluoric acid (HF) solution or a mixture of hydrofluoric acid (HF) and hydrogen peroxide (H$_2$O$_2$) at a ratio from 1 to 1 to 1 to 10 can be used. Again, the SiN layer 22b of the base layer 22 functions as a stopper, and the progress of the wet etching is stopped at the top surface of the base layer 22. By removing the silicide 31, the illustrated capacitor cell is isolated from adjacent cell capacitors (not shown), and at the same time, a bottom electrode of the cell capacitor is defined precisely.

The removal of silicide 31 by a wet process greatly facilitates the isolation of cell capacitors and the formation of the bottom electrode even if a metal of the platinum group is used as the bottom electrode material. In contrast, processing the ruthenium (Ru) layer 29 by, for example, reactive ion etching (RIE), as in the conventional method, cannot achieve reliable isolation of cell capacitors because it is inherently difficult to process a metal belonging to the platinum group, and because the aperture between adjacent cylinder shells is so narrow.

When the silicide 31 is removed, a groove 33 is formed in the bottom electrode layer 29 around the outer face of the cylinder shell near the bottom of the cylinder. A portion of the TiN glue layer 27 is exposed between the lower end of the bottom electrode 29 and the base layer 22.

Figure 3M:
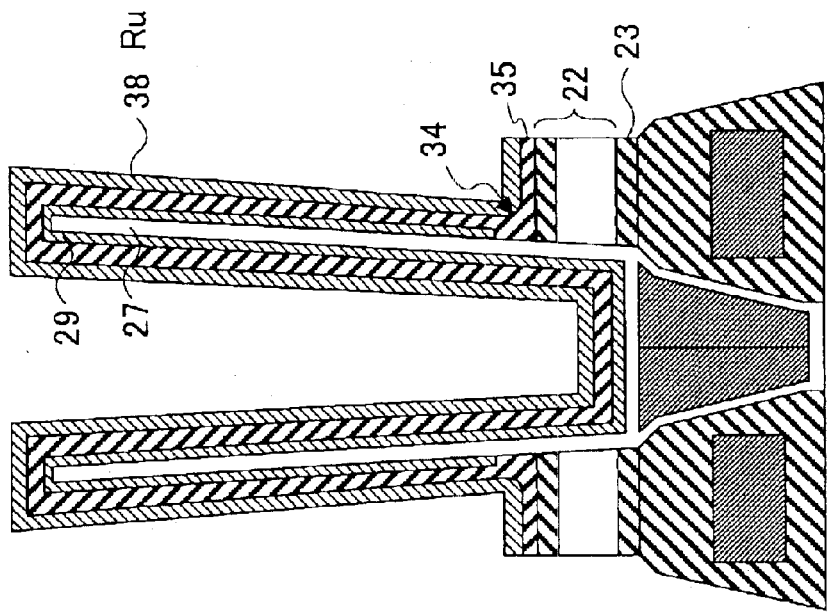
Figure 3L:
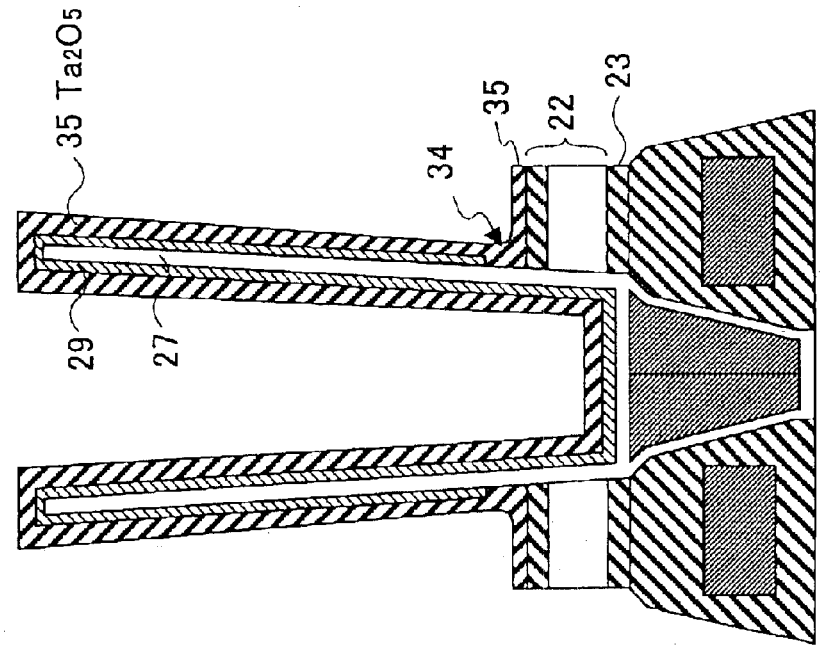

Then, as illustrated in FIG. 3L, dielectric layer 35 comprising tantalum pentoxide (Ta$_2$O$_5$) with a thickness of 10 nm is formed over the bottom electrode 29 and the base layer 22 by CVD at the temperature of 450 to 480 degrees. In the CVD process, pentaethoxytantal (Ta(OC$_2$H$_5$)$_5$) is used as the precursor. Since tantalum pentoxide (Ta$_2$O$_5$) has good coverage, the groove 33 resulting from the removal of the silicide 31 is filled with this material, and the tantalum pentoxide (Ta$_2$O$_5$) dielectric layer 35 may contact the TiN glue layer 27 in the groove 33. However, the Ta$_2$O$_5$ dielectric layer 35 becomes thicker in the groove 33, taking the depth of the groove 33 into account, and local leakage current can be substantially reduced. The thickened portion 34 of the Ta$_2$O$_5$ dielectric layer 35 between the lower end of the bottom electrode 29 and the base layer 22 functions as a cell isolation part.

Finally, as illustrated in FIG. 3M, a top electrode layer 38 comprising ruthenium (Ru) is formed over the $Ta_2O_5$ dielectric layer 35 by CVD, and the cell capacitor is completed. Although not shown in the drawing, the cell capacitors are covered with an insulating layer, which is then subjected to planarization, and upper-layer interconnects are formed.

As has been explained above, a portion of the bottom electrode layer is silicidized, and the resulting silicide is selectively removed by a wet process. Silicide is removed easily by a wet process, and therefore, cell capacitors are isolated from each other in a simplified and reliable manner even if a platinum-group metal is used as the bottom electrode material.

The glue layer (or the barrier metal layer) 27 is maintained throughout the fabrication process, and a fall of the cylinder shell or loss of the plug is effectively prevented. The product yield is also improved.

Since it is unnecessary to remove the glue layer (or the barrier metal layer) 27, unlike in the conventional technique, the number of fabrication steps is reduced. The glue layer (or the barrier metal layer) 27 is maintained throughout the fabrication process, and it retains the Ru bottom electrode 29 securely, together with the base layer 22 and the support layer 23.

The semiconductor memory device fabricated by the process shown in FIGS. 3A through 3M comprises a glue layer (or a barrier metal layer) 27 defining a cylinder shell, a bottom electrode 29 covering the inner face and the outer face of the cylinder shell of the glue layer 27, a dielectric layer 35 positioned over the bottom electrode layer 29, and a top electrode 38 positioned over the dielectric layer 35. The glue layer 27 comprises a refractory material. The bottom electrode 29 comprises a platinum group material. The dielectric layer 35 comprises an oxide dielectric with a high dielectric constant, or alternatively, it may comprise an oxide ferroelectric.

The dielectric layer 35 has a thickened portion 34 around the outer face of the cylinder shell near the bottom of the cylinder. The thickened portion 34 functions as a cell isolation part. The semiconductor memory device also comprises a base layer 22 for retaining the cylinder shell of the glue layer 27, and the thickened portion 34 extends between the lower end of the bottom electrode 29 and the base layer 22, which becomes the end portion of the cell isolation part.

Because the bottom electrode 29 is held stably over the glue layer (or the barrier metal layer) 27, undesirable separation or local peeling of the bottom electrode 29 does not occur. The thickened portion or the cell isolation 34 substantially reduces local leakage current at the contact area between the glue layer 27 and the dielectric layer 35, and reliable operations of the semiconductor memory device are guaranteed.

FIGS. 4A through 4L illustrate a fabrication process of a semiconductor memory device according to the second embodiment of the invention.

First, as illustrated in FIG. 4A, a hole 20a is formed in the silicon nitride (SiN) layer 20, after the bit lines 15 comprising, for example, tungsten (W) are formed. Then, a contact metal layer 36 comprising titanium (Ti) is formed on the bottom of the hole 20a up to a thickness of about 15 nm. Subsequently, the hole 20a is filled with titanium nitride (TiN) by CVD, which is then subjected to CMP for planarization to form a TiN plug 37. The plug material is not limited to TiN, as long as it is the same material as that of the glue layer (i.e., the barrier metal layer) of the cell capacitor. Thus, in the second embodiment, the plug 37 coupling the cell capacitor with the underlying access transistor (see FIG. 2) is made of the same material as that of the glue layer.

Then, as illustrated in FIG. 4B, a support layer 43 comprising silicon nitride (SiN) is formed over the TiN plug 37 and the SiN layer 20. Over the SiN support layer 43 is formed a polysilicon layer 44 with a thickness of 10 nm. The polysilicon layer 44 is used for silicidation which is to be carried out in the later step.

Then, as illustrated in FIG. 4C, $SiO_2$ insulating layer 45 with a thickness of 900 nm is formed over the polysilicon layer 24 in order to form a storage node.

Then, as illustrated in FIG. 4D, a hole 46 is formed in the $SiO_2$ insulating layer 45 by etching a portion of the $SiO_2$ insulating layer 45, the polysilicon layer 44, and the SiN support layer 43 until the TiN plug 37 is exposed.

Then, as illustrated in FIG. 4E, a glue layer (or a barrier metal layer) 47 with a thickness of 10 nm is formed inside the hole 46 and over the top face of the $SiO_2$ insulating layer 45. As has been described above, the glue layer 47 is made of the same material as that of the plug 37. Accordingly, titan nitride (TiN) glue layer 47 is formed in this example. Then, the TiN glue layer 47 located on the top surface of the $SiO_2$ insulating layer 45 is removed by etching or CMP. Although not shown in the drawing, the hole 26 is filled with a resist or SOG before the removal of the top portion of the TiN glue layer 47, in order to prevent dust or slurry from remaining in the hole 46.

Then, as illustrated in FIG. 4F, the $SiO_2$ insulating layer 45 is removed by wet etching using an echant containing hydrofluoric acid. When the $SiO_2$ insulating layer 45 is removed, a cylinder shell defined by the TiN glue layer 47 remains above the plug 37. Since the glue layer (or the barrier metal layer) 47 is made of the same material as the plug 37, the glue layer 47 and the plug 37 are integrated into a single unit, and the cylinder shell is retained stably without a base layer.

Then, as illustrated in FIG. 4G, bottom electrode layer 49 comprising iridium (Ir) is formed over the TiN glue layer 47 defining the cylinder shell, as well as over the top face of the polysilicon layer 44.

Then, as illustrated in FIG. 4H, a thermal process is carried out at a temperature of 350 degrees C. for silicidation of a portion of the Ir bottom electrode layer 49. During the thermal process, the Ir bottom electrode layer 49 positioned directly on the polysilicon layer 44 is silicidized, while the Tr bottom electrode layer 49 covering the TiN glue layer 49 stays stable without reaction.

As the result of the thermal process, silicide 51 is formed around the outer face of the cylinder, which is defined by the TiN glue layer 47 and the Ir bottom electrode layer 49 covering the inner face and the outer face of the TiN cylinder shell, at or near the bottom of the cylinder, as illustrated in FIG. 4I. The silicide 51 is then selectively removed by wet etching using hydrofluoric acid or other appropriate etchant. By removing the silicide 51, the bottom electrode 49 of the cylinder-type capacitor is defined, and at the same time, the cell capacitor is isolated from adjacent cell capacitors (not shown). The combination of the silicidation and wet etching facilitates the formation of the bottom electrode and the cell isolation. After the silicide 51 is removed, a groove (or a slit) 53 is formed around the cylinder near the bottom of the cylinder, and a portion of the TiN glue layer is exposed between the lower end of the bottom electrode 49 and the SiN layer 43.

Then, as illustrated in FIG. 4K, dielectric layer 55 comprising strontium titanate ($SrTiO_3$) is formed over the entire surface (that is, over the bottom electrode 49 and the SiN layer 43) by chemical vapor deposition (CVD) at a thickness of 20 nm. Since strontium titanate has a good coverage, the groove 53 is filled with the dielectric layer 55. The dielectric layer 55 becomes thicker in and near the groove 53. Accordingly, even if the TiN glue layer (or the barrier metal layer) 47 comes into contact with the dielectric layer 55, local leakage can be substantially reduced. This thickened portion 54 of the dielectric layer 55 between the lower end of the bottom electrode 49 and the SiN layer 43 becomes the end portion of the cell isolation part for separating the capacitor from adjacent capacitors (not shown).

Then, as illustrated in FIG. 4L, top electrode layer 57 comprising iridium (Ir) is formed over the dielectric layer 55 by CVD, and the cylinder-type stacked capacitor is completed. Although not shown, an interlevel dielectric is formed over the capacitor, and an upper-layer interconnect is formed on the planarized surface of the interlevel dielectric.

With the fabrication method of the second embodiment, the glue layer (or the barrier metal layer) that defines a cylinder shell is formed with the same material as the plug for coupling the cell capacitor to the access transistor. The glue layer and the plug are integrated into a single unit, and a stable cylinder structure is realized, without forming a base layer or retaining layer surrounding the base of the cylinder. Accordingly, the number of fabrication steps can be reduced.

As in the first embodiment, silicide is formed in a portion of the bottom electrode layer, and removed by a wet process. Accordingly, formation of the bottom electrode, as well as cell isolation, is greatly facilitated.

The semiconductor memory device with the cylinder-type stacked capacitor fabricated by the above-described process comprises a glue layer (or a barrier metal layer) 47 made of a refractory material and defining a cylinder shell, a bottom electrode 49 of a platinum-group material covering the inner face and the outer face of the cylinder shell, a dielectric layer 55 positioned over the bottom electrode 49, and a top electrode 57 positioned over the dielectric layer 55.

The bottom electrode 49, the dielectric layer 55, and the top electrode 57 comprise a cylinder-type stacked capacitor. The dielectric layer 55 has a thickened portion 54 around the outer face of the cylinder shell at the bottom of the cylinder, which functions as a cell isolation part for isolating the capacitor from adjacent capacitors (not shown).

The semiconductor memory device further comprises a plug 37, which is made of the same material as the glue layer 47 and couples the capacitor to the associated access transistor (see FIG. 2). The plug 37 and the glue layer 47 are integrated into a single unit, and retain the cylinder-type stacked capacitor in a stable manner, without a base layer or a retaining layer around the cylinder shell.

Since the base layer or the retaining layer is not required, the effective area of the cell capacitor is increased, and consequently, the capacitance of each cell capacitor is increased.

FIGS. 5A through 5L illustrate a fabrication process of a semiconductor memory device according to the third embodiment of the invention.

First, as illustrated in FIG. 5A, a hole 20a is formed in the silicon nitride (SiN) layer 20, after the bit lines 15 comprising, for example, tungsten (W) is formed. Then, a contact metal layer 66 comprising titanium (Ti) is formed on the bottom of the hole 20a, and subsequently, the hole 20a is filled with titanium nitride (TiN) by CVD. The TiN layer is planarized by CMP until the top face of the SiN layer 20 is exposed, thereby forming a TiN plug 67.

Then, as illustrated in FIG. 5B, a support layer 73 comprising silicon nitride (SiN) is formed over the TiN plug 67 and the SiN layer 20, at a thickness of 40 nm. Over the SiN support layer 73 is formed a base layer 74 comprising tantalum oxide (TaO) with a thickness of 100 nm, as illustrated in FIG. 5C. Since tantalum oxide has good adhesion with respect to a metal of the platinum group, the TaO layer 74 can be used to retain the bottom electrode. Of course, other compositions of tantalum oxide or other insulating material having good adhesion with a platinum-group material can also be used.

Then, as illustrated in FIG. 5D, a $SiO_2$ insulating layer 75 with a thickness of 900 nm is formed over the TaO base layer 74. Over the $SiO_2$ insulating layer 75 is formed a polysilicon layer 77, as illustrated in FIG. 5E. The polysilicon layer 77 is to be used for a partial silicidation of a bottom electrode layer in the later steps, as in the first and second embodiment.

Then, as illustrated in FIG. 5F, a hole 76 reaching the plug 67 is formed by dry etching. The polysilicon layer 77, the $SiO_2$ insulating layer 75, the TaO base layer 74, and the SiN support layer 73 are etched sequentially. When etching the SiN support layer 73 by a dry process, the etching is moderated so as not to damage the surface of the plug 67.

Then, as illustrated in FIG. 5G, a bottom electrode layer 79 comprising ruthenium (Ru) is formed in the hole 76 and over the polysilicon layer 77 at a thickness of 30 nm. In the third embodiment, a glue layer or a barrier metal is not inserted between the bottom electrode layer and the $SiO_2$ insulating layer 75 because the TaO base layer 74 having good adhesion with platinum-group materials is used. The bottom electrode layer 79 is retained securely by the TaO base layer 74 above the TiN plug 67. Then, a thermal process is carried out at 400–450 degrees C. for silicidation to cause reaction between the ruthenium (Ru) 79 and the polysilicon 77, as illustrated in FIG. 5H.

Figure 5K:
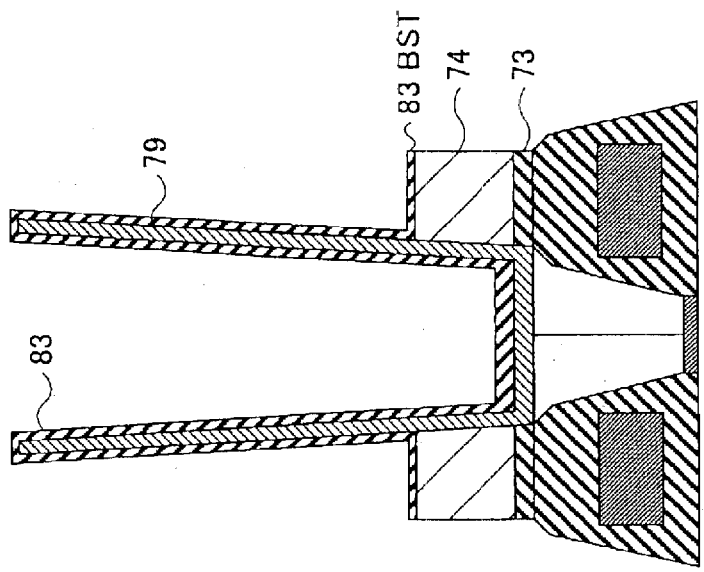
Figure 5J:
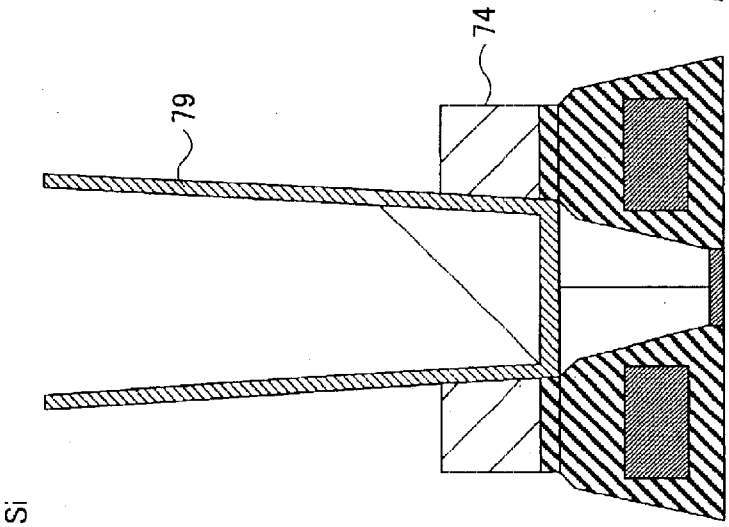
Figure 5I:
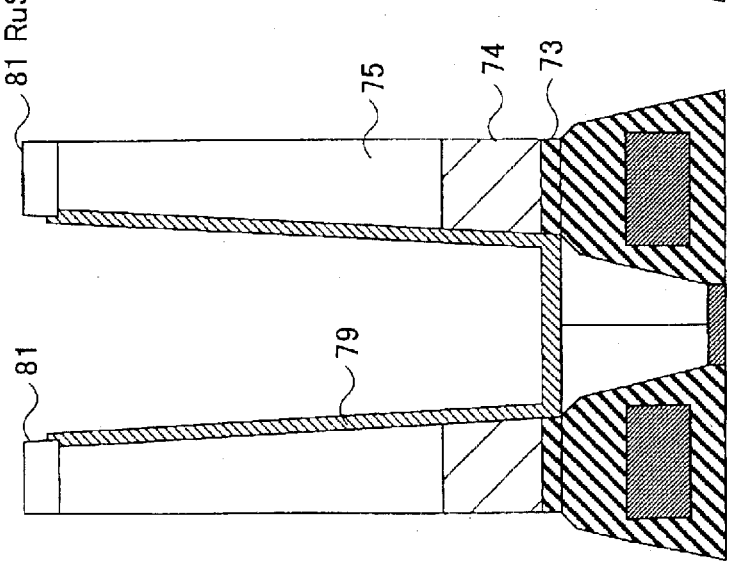

As a result, silicide 81 is formed in a portion of the bottom electrode layer 79 at the top of the $SiO_2$ insulating layer 75, as illustrated in FIG. 5I. Then, as illustrated in FIG. 5J, silicide 81 and $SiO_2$ insulating layer 75 are simultaneously removed by a wet process using an etchant of the hydrofluoric acid family, and ruthenium (Ru) bottom electrode 79 shaped in a cylinder shell remains. In this step, cell isolation of the capacitor and formation of the bottom electrode of the capacitor are carried out at the same time in a simple and reliable manner, without using a CMP process. The Ru bottom electrode 79 is retained securely by the TaO base layer 74 having good adhesion with the platinum-group material.

Then, as illustrated in FIG. 5K, dielectric layer 83 comprising barium strontium titanate (BST) is formed by CVD at a thickness of 15 nm over the bottom electrode 79 and the TaO base layer 74. Then, as illustrated in FIG. 5L, a top electrode layer 85 comprising ruthenium (Ru) with a thickness of 30 nm is formed over the dielectric layer 83. The bottom electrode 79, the dielectric layer 83 and the top electrode 85 comprise a cylinder-type stacked capacitor.

In the third embodiment, a glue layer or a barrier metal layer is not used, and therefore, the number of fabrication steps can be reduced. The cell capacitor is separated from adjacent ones (not shown) at the top of the cylinder shell, unlike the first and second embodiments. This cell separation is carried out in a single step because the silicide 81 and the $SiO_2$ insulating layer 75 are simultaneously removed in the same wet process. This arrangement further simplifies the fabrication process. The Ru bottom electrode layer is processed easily without using a CMP process, and the fabrication process is facilitated as a whole.

As has been described above, in the present invention, a portion of the bottom electrode layer of a platinum-group material is silicidized, and the silicide is selectively removed by a wet process. Accordingly, processing of the bottom electrode is greatly facilitated, without using dry etching techniques and a CMP process. The cell capacitor can be isolated from adjacent cell capacitors easily and precisely in a self-aligning manner.

The cylinder shell is held securely throughout the fabrication process, and fall of the cylinder or loss of the plug is prevented.

Thus, a low-cost high-yield process can be realized by cell separation (and formation of a bottom electrode) making use of silicidation, realizing a stable structure of the cylinder shell.

Although the present invention has been described based on specific embodiments, the present invention is not limited to these examples, and there are many modifications and substitutions that can be made without departing from the scope of the present invention.

For example, the invention is applied to a DRAM with a COB (capacitor over bitline) structure having a high dielectric capacitor in the embodiments; however, the invention is equally applied to a DRAM with a CUB (capacitor under bitline) structure or an FeRAM having a ferroelectric capacitor.

Although ruthenium (Ru) and iridium (Ir) are used as the electrode material in the examples, one or more materials selected from a group consisting Ruthenium (Ru), iridium (Ir), Rhenium (Re), platinum (Pt), palladium (Pd), rhodium (Rh), and osmium (Os), including alloys, may be used as the electrode material.

The material used in the glue layer is not limited to titanium nitride (TiN). One or more materials (including alloys) selected from a group consisting of refractory metals, such as titanium (Ti), tantalum (Ta), tungsten (W), zirconium (Zr), hafnium (Hf), and niobium (Nb) can be equally used. Furthermore, a nitride or a silicide nitride of these refractory metals can also be used. Examples of such nitride other than TiN include, but are not limited to, TaN, WN, ZrN, HfN, NbN, and combinations of these materials. Examples of such a silicide nitride include, but not limited to, TiSiN, TaSiN, WSiN, ZrSiN, HfSiN, SbSiN, and combinations of these materials.

Although, in the embodiments, the electrode layer comprising a platinum-group material is formed by chemical vapor deposition (CVD), the present invention is not limited to this example. Other chemical methods, physical methods (such as sputtering or vapor deposition), electrochemical methods (such as plating), or a combination of these methods can be used to form an electrode layer. Similarly, the formation of a glue layer defining a cylinder shell is not limited to CVD, but can be achieved by chemical methods other than CVD, physical methods (such as sputtering or vapor deposition), electrochemical methods (such as plating), or a combination of these methods.

What is claimed is:

1. A semiconductor memory device comprising:
   a glue layer defining a cylinder shell;
   a bottom electrode covering an inner face and an outer face of the cylinder shell, the bottom electrode being made of a material of the platinum group;
   a dielectric layer positioned over the bottom electrode; and
   a top electrode positioned over the dielectric layer.

2. The semiconductor memory device described in claim 1, wherein the dielectric layer has a thickened portion around the outer face of the cylinder shell near the bottom of the cylinder shell, the thickened portion functioning as a cell isolation part.

3. The semiconductor memory device described in claim 2, further comprising a base layer surrounding the cylinder shell near the bottom of the cylinder shell, wherein the thickened portion of the dielectric layer is located between the base layer and a lower end of the bottom electrode covering the outer face of the cylinder shell.

4. The semiconductor memory device described in claim 1, further comprising a plug coupled to the bottom of the cylinder shell and made of the same material as the glue layer, wherein the cylinder shell defined by the glue layer is retained directly above the top face of the plug.

5. The semiconductor memory device described in claim 1, wherein the glue layer is formed of a refractory material including any of a refractory metal, an alloy of the refractory metal, a nitride of the refractory metal, an alloy of the nitride of the refractory metal, a silicate nitride of the refractory metal, an alloy of the silicate nitride of the refractory metal, and a combination thereof.

6. The semiconductor memory device described in claim 1, wherein the material of the platinum group is selected from Ru, Ir, Re, Pt, Pd, Rh, Os, and an alloy thereof.

7. The semiconductor memory device described in claim 1, wherein the glue layer is formed of a material selected from the group of Ti, Ta, W, Zr, Hf, Nb, and an alloy thereof.

8. The semiconductor memory device described in claim 1, wherein the glue layer is formed of a material selected from the group of TiN, TaN, WN, ZrN, HfN, NbN, and an alloy thereof.

9. The semiconductor memory device described in claim 1, wherein the glue layer is formed of a material selected from the group of TiSiN, TaSiN, WSiN, ZrSiN, HfSiN, NbSiN, and an alloy thereof.

10. The semiconductor ineniory device described in claim 1, wherein the dielectric layer is formed of an oxide high-dielectric material or an oxide ferroelectric material.

* * * * *